(12) United States Patent
Huang et al.

(10) Patent No.: US 9,635,767 B2
(45) Date of Patent: Apr. 25, 2017

(54) FLAT PANEL DISPLAY DEVICE

(71) Applicant: SHENZHEN CHINA STAR OPTOELECTRONICS TECHNOLOGY CO., LTD., Shenzhen (CN)

(72) Inventors: Chong Huang, Shenzhen (CN); Gege Zhou, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 21 days.

(21) Appl. No.: 14/416,819

(22) PCT Filed: Dec. 11, 2014

(86) PCT No.: PCT/CN2014/093538
§ 371 (c)(1),
(2) Date: Jun. 25, 2015

(87) PCT Pub. No.: WO2016/041267
PCT Pub. Date: Mar. 24, 2016

(65) Prior Publication Data
US 2016/0330851 A1    Nov. 10, 2016

(30) Foreign Application Priority Data

Sep. 16, 2014 (CN) .......................... 2014 1 0471821

(51) Int. Cl.
*G06F 1/16*   (2006.01)
*H05K 5/00*   (2006.01)
(Continued)

(52) U.S. Cl.
CPC ......... *H05K 5/0017* (2013.01); *G02F 1/1333* (2013.01); *G02F 1/133308* (2013.01);
(Continued)

(58) Field of Classification Search
CPC ........ G02F 1/133308; G02F 1/133314; G06F 1/1601
See application file for complete search history.

(56) References Cited

U.S. PATENT DOCUMENTS 5,531,950 A * 7/1996 Kimura ............... B29C 37/0078
264/135
6,016,175 A   1/2000 Kim
(Continued)

FOREIGN PATENT DOCUMENTS

CN          1687825 A      10/2005
CN       202929321 U        5/2013
(Continued)

OTHER PUBLICATIONS

International Search Report (PCT/ISA/210) and the Written Opinion (PCT/ISA/237) issued on Jun. 19, 2015, by the Chinese Patent Office in corresponding International Application No. PCT/CN2014/093538. (9 pages).

*Primary Examiner* — Anthony Q Edwards
(74) *Attorney, Agent, or Firm* — Buchanan Ingersoll & Rooney PC

(57) ABSTRACT

A flat panel display device comprising a backboard and a display panel fitted therewith is provided. The edge of the backboard is structured as a barrier wall extending perpendicular to the body of the backboard. A stepped groove is arranged on the interior face of the barrier wall for supporting the display panel and forming accommodating space between the display panel and the body of the backboard. The stepped groove extends from an outer end of the barrier wall towards the body of the backboard, and the depth of the stepped groove is consistent with the thickness of the display panel. The backboard is made of plastic plate containing a enhancing element. The flat panel display device according (Continued)

Figure 1:
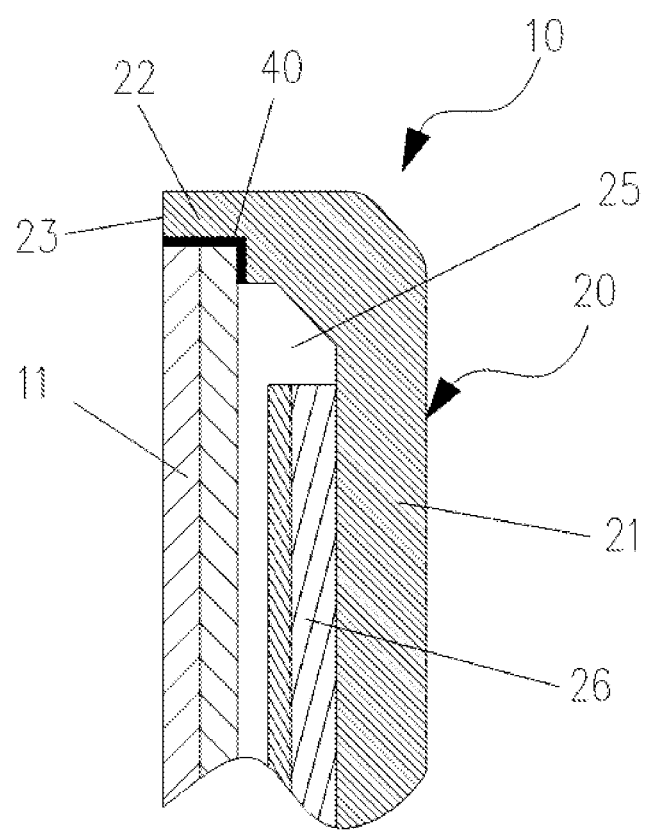

to the present disclosure can be designed as a light and thin display device with no frame, and thus is suitable for making an all-in-one machine.

9 Claims, 3 Drawing Sheets

(51) Int. Cl.
*H05K 7/14* (2006.01)
*G02F 1/1333* (2006.01)
*H04N 5/64* (2006.01)

(52) U.S. Cl.
CPC ............... *H05K 7/1427* (2013.01); *G02F 2001/133314* (2013.01); *H04N 5/64* (2013.01)

(56) References Cited

U.S. PATENT DOCUMENTS

| | | | | |
|---|---|---|---|---|
| 7,178,967 B2* | 2/2007 | Kim | ............... | G02F 1/133308 349/58 |
| 8,031,462 B2* | 10/2011 | Kobayashi | ........ | B29C 45/14688 348/333.01 |
| 8,203,786 B2* | 6/2012 | Hine | ........ | H04N 5/64 349/58 |
| 8,350,983 B2* | 1/2013 | Wang | ............... | G02F 1/133615 349/58 |
| 8,648,978 B2* | 2/2014 | Sato | ............... | G06F 1/1601 313/582 |
| 8,861,198 B1* | 10/2014 | Asuncion | ............... | G06F 1/1658 361/679.3 |
| 8,934,227 B2* | 1/2015 | Cheon | ............... | H05K 5/02 345/905 |
| 9,063,374 B2* | 6/2015 | Kuo | ............... | G02F 1/133608 |
| 2006/0028790 A1* | 2/2006 | Baek | ............... | G02F 1/133308 361/679.21 |
| 2007/0241991 A1* | 10/2007 | Tsai | ............... | G02F 1/133308 345/7 |
| 2009/0303409 A1* | 12/2009 | Park | ............... | G02F 1/133308 349/58 |
| 2010/0215938 A1* | 8/2010 | Wang | ............... | B29C 45/14311 428/223 |
| 2011/0222218 A1* | 9/2011 | Kim | ............... | H04N 5/65 361/679.01 |
| 2012/0274871 A1* | 11/2012 | Yamazaki | ......... | G02F 1/133605 349/58 |
| 2013/0242226 A1* | 9/2013 | Jeong | ............... | G06F 1/1637 349/58 |
| 2014/0055705 A1* | 2/2014 | Yu | ............... | G02F 1/133308 349/58 |
| 2014/0055711 A1* | 2/2014 | Gu | ............... | H05K 5/0017 349/58 |
| 2015/0103288 A1* | 4/2015 | Lee | ............... | G02F 1/133608 349/58 |

FOREIGN PATENT DOCUMENTS

| | | |
|---|---|---|
| CN | 203607042 U | 5/2014 |
| JP | 2014-077900 A | 5/2014 |
| JP | 2014-126740 A | 7/2014 |

\* cited by examiner

FLAT PANEL DISPLAY DEVICE

CROSS-REFERENCE TO RELATED APPLICATION

The present application claims benefit of Chinese patent application CN 201410471821.3, entitled "FLAT PANEL DISPLAY DEVICE" and filed on Sep. 16, 2014, which is incorporated herein by reference.

TECHNICAL FIELD

The present disclosure relates to a liquid crystal module. Specifically, the present disclosure relates to a flat panel display device.

TECHNICAL BACKGROUND

Thin film transistor liquid crystal display device (TFT-LCD) is one of the major types of flat panel display at present, and is widely applied in electronic equipment.

A thin film transistor liquid crystal display device comprises a backlight, a liquid crystal panel, and a front frame. The liquid crystal panel itself does not emit light, but displays images through the light source provided by the backlight. The backlight mainly comprises a backboard, an optical module, and a rubber frame. Among others, the rigidity of the backboard is a key factor that influences the size of the display device. In the prior art, in order to guarantee the rigidity, the backboard is usually made of sheet metal, such as aluminium plate. However, due to the large density of metal, the display device thus made is generally very heavy. In this case, it is difficult to manufacture a light and thin display device.

SUMMARY OF THE INVENTION

In order to solve the above technical problem in the prior art, the present disclosure provides a flat panel display device, which is light and thin with no frame, and suitable for manufacturing an all-in-one machine.

(1) According to the present disclosure, a flat panel display device is provide, comprising a backboard and a display panel fitted therewith, the edge of the backboard being structured as a barrier wall extending perpendicular to the body of the backboard, wherein a stepped groove is arranged on the interior face of the barrier wall for supporting the display panel, so that an accommodation space is formed between the display panel and the body of the backboard.

In the flat panel display device according to the present disclosure, the accommodation space formed between the barrier wall of the backboard and the body of the backboard can be used for accommodating other necessary components for an all-in-one machine. Therefore, the flat panel display device is not only suitable for making an all-in-one machine, but also very light and thin.

(2) In an embodiment according to (1) of the present disclosure, the stepped groove extends from an outer end of the barrier wall towards the body of the backboard, and the depth of the stepped groove is consistent with the thickness of the display panel, so that the outer surface of the display panel is in the same plane as the outer end of the barrier wall. With such structure, the flat panel display device according to the present disclosure can be frameless. A frameless flat panel display device has a larger display area, and it can be very light and thin.

(3) In an embodiment according to (1) or (2) of the present disclosure, the body of the backboard and the base part of the barrier wall are made of plastic plate, a first enhancing element being provided inside the body of the backboard. The first enhancing element enables the rigidity of the plastic plate to be improved without having to make a relatively thick backboard. In addition, plastic has a relatively small density, so that a backboard thus made can be light weighted and very thin. In this case, a light and thin flat panel display device can be manufactured.

(4) In an embodiment according to (3) of the present disclosure, the first enhancing element is a metallic framework. The metallic framework comprises a frame, and reinforcing ribs connected between the opposite sides of the frame. The flat panel display device further comprises a mounting member for a wall rack, the mounting member being fixedly mounted to the reinforcing ribs. Such a structure can significantly enhance the fastness of a flat panel display device mounted to a wall rack.

(5) In an embodiment according to (3) or (4) of the present disclosure, a second enhancing element is provided inside the barrier wall. In an embodiment, the second enhancing element is a metallic framework or metal wires. Such structure can enhance the rigidity of the barrier wall, and is applicable for a relatively large and heavy display panel. In a preferred embodiment, the second enhancing element is a metallic framework or metal wires.

(6) In an embodiment according to (3) or (5) of the present disclosure, the backboard is formed by adding the first enhancing element and the second enhancing element into molten plastic and then allowing the molten plastic cooled. After cooling, the first and second enhancing elements can be bound tightly to the plastic base part, thereby improving the rigidity of the backboard.

(7) In an embodiment according to (1) or (2) of the present disclosure, the display panel is fixed to the backboard through any one of glue, fastening structure, and magnetic absorption.

(8) In an embodiment according to (7) of the present disclosure, the fastening structure comprises a first fastener and a second fastener which can interlock with each other, wherein the first fastener is a first belt arranged in the stepped groove, on which a plurality of first projections perpendicularly extending outward are provided, and the second fastener is a second belt arranged on a mounting surface of the display panel, on which a plurality of second projections perpendicularly extending outward are provided, and the first fastener and the second fastener are coupled with each other through inserting the plurality of first projections into the gaps formed among the plurality of second projections respectively and inserting the plurality of second projections into the gaps formed among the plurality of first projections respectively.

In a specific embodiment, the first projections each comprise a first column, which is connected to the first belt with one end of the first column and extends perpendicularly outward, and a first sphere connected to the other end of the first column, the diameter of the first sphere being larger than that of the first column, the second projections each comprise a second column, which is connected to the second belt with one end of the second column and extends perpendicularly outward, and a second sphere connected to the other end of the second column, the diameter of the second sphere being larger than that of the second column, and the first fastener and the second fastener are interlocked with each other through accommodating the first spheres in the spaces formed among the plurality of second columns respectively and accommodating the second spheres in the spaces among the plurality of first columns respectively.

Such a fastening structure is easy to assembly, thereby simplifying the production.

As compared with the prior art, the present disclosure has the following advantages. The groove formed by the barrier wall of the backboard and the body of the backboard can accommodate other components necessary for making an all-in-one machine. Therefore, the flat panel display device according to the present disclosure is suitable for making an all-in-one machine. The depth of the stepped groove is consistent with the thickness of the display panel, so that the display panel can be in the same plane with the outer end of the barrier wall during assembly, thereby enabling the flat panel display device to be frameless. Furthermore, the backboard is made of plastic plate, and a first enhancing element is arranged inside the body of the backboard and a second enhancing element is arranged inside the barrier wall. In this manner, under the condition of being rigid enough, the backboard thus obtained can still be very thin and light weighted, thereby enabling the flat panel display device to be thin and light.

BRIEF DESCRIPTION OF THE ACCOMPANYING DRAWINGS

Figure 2:
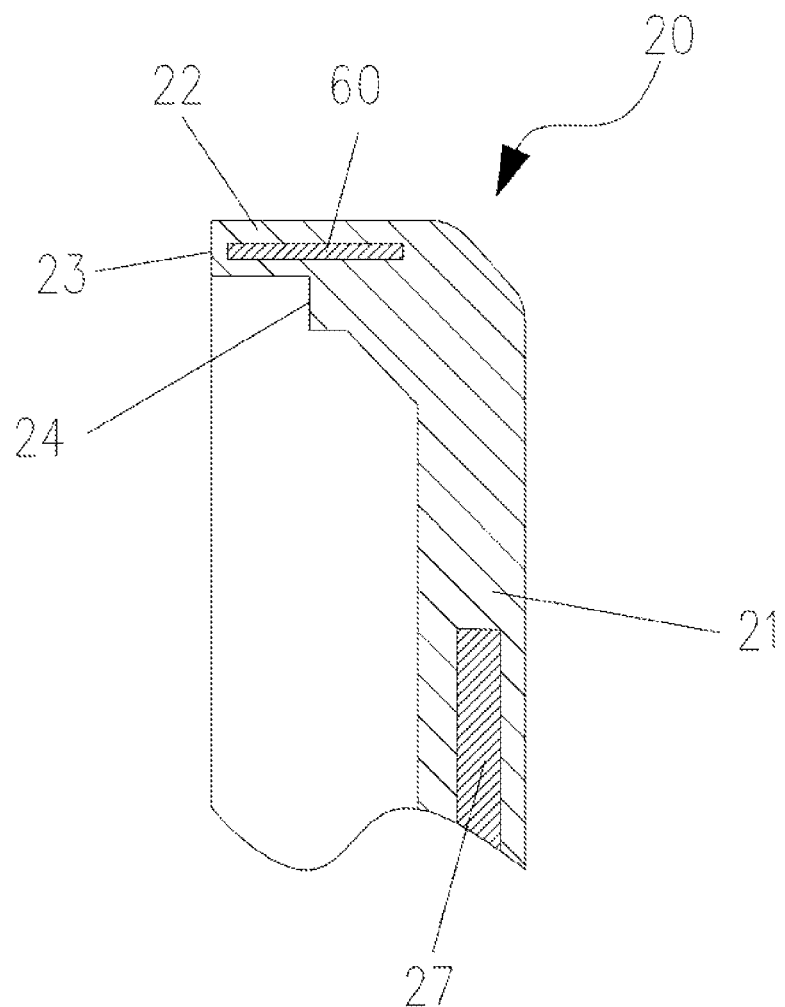
Figure 3:
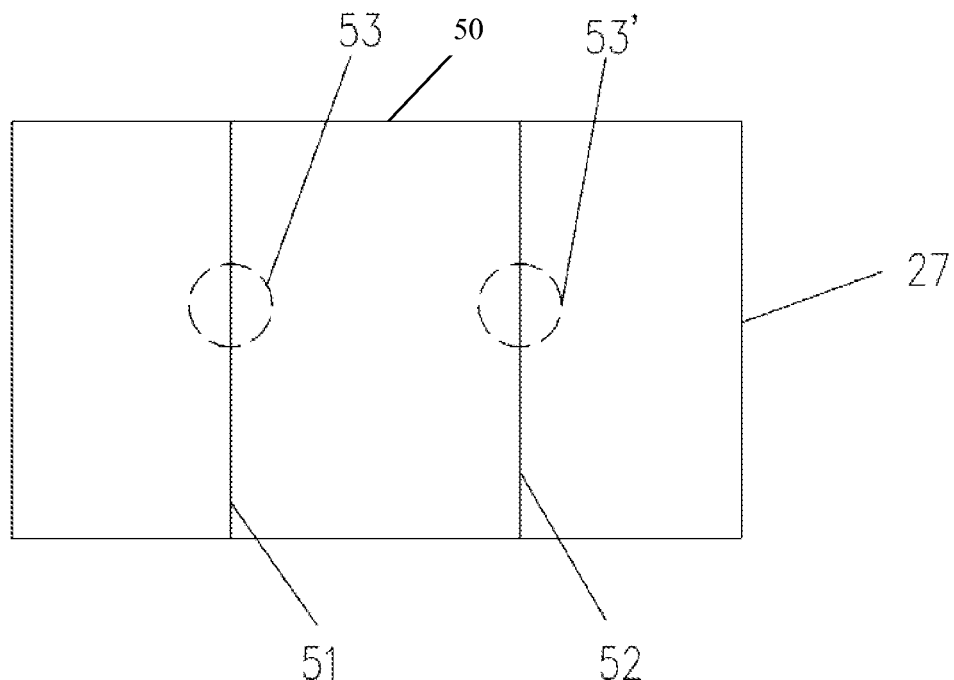
Figure 4:
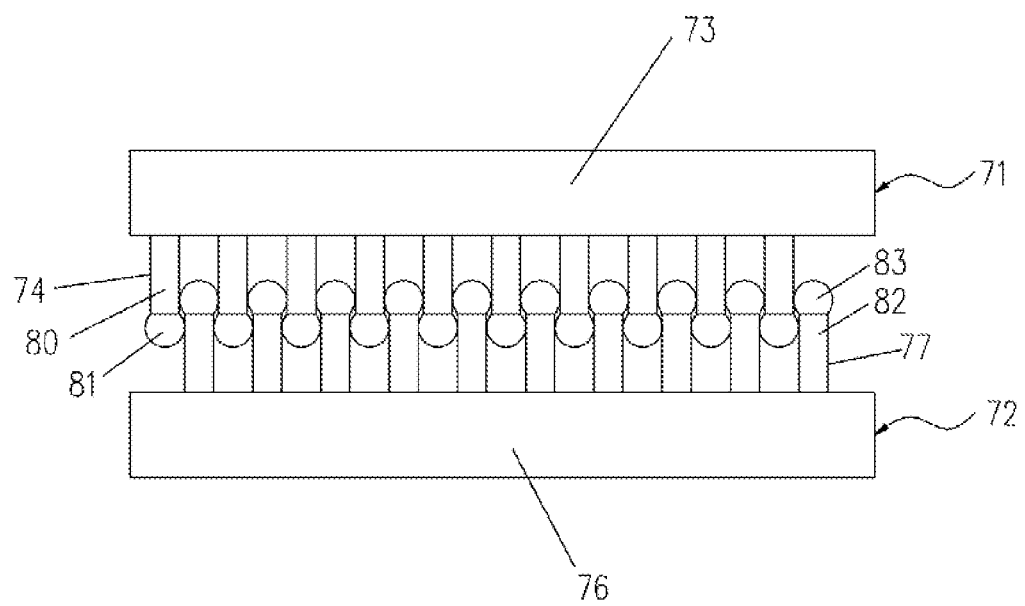

The present disclosure will be explained in detail with reference to the embodiments and the accompanying drawings. In the drawings:

FIG. 1 schematically shows the structure of a part of a flat panel display device according to the present disclosure, FIG. 2 shows a sectional view of a part of a backboard according to the present disclosure, FIG. 3 schematically shows a first enhancing element according to the present disclosure, and FIG. 4 schematically shows the structure of a fastening structure according to the present disclosure.

In the accompanying drawings, the same components are marked with the same reference sign. The drawings are not drawn to actual scale.

DETAILED DESCRIPTION OF THE EMBODIMENTS

The present disclosure will be further illustrated with reference to the accompanying drawings.

FIG. 1 schematically shows the structure of a flat panel display device 10 according to the present disclosure. Only a part of the flat panel display device 10 is illustrated herein. Other parts are the same as this part, and thus will not be described in detail. The flat panel display device 10 comprises a backboard 20 and a display panel 11 fitted therewith. The flat panel display device 10 further comprises other auxiliary components, such as a support (not shown), etc. These components and the assembly structure thereof are all well known to one skilled in the art, and thus will not be described in detail for the sake of simplicity.

As shown in FIGS. 1 and 2, the edge of the backboard 20 is structured as a barrier wall 22 substantially perpendicular to a body 21 of the backboard. The backboard 20 forms a groove structure as a whole. For facilitating the assembly of the flat panel display device 10, a stepped groove 24 (as shown in FIG. 2) extending from an outer end 23 of the barrier wall 22 towards the body 21 of the backboard is arranged on the inner wall of the barrier wall 22. Therefore, the flat panel display device 10 can be fixedly disposed on the stepped groove 24. In an example, double sided tape, glue, magnet, suction nozzle, or fastening member can be arranged in a gap 40 formed between the stepped groove 24 and the display panel 11, so that the display panel 11 can be fixedly connected to the backboard 20.

As shown in FIG. 1, the depth of the stepped groove 24 is consistent with the thickness of the display panel 11, so that the outer surface of the display panel 11 is in the same plane as the outer end 23 of the barrier wall 22 after the assembly of the display panel 11. In this case, a design of frameless structure or narrow frame of the flat panel display device is achieved.

The backboard 20 having a grooved structure allows an accommodating space 25 (as shown in FIG. 1) to be formed between the display panel 11 and the body 21 of the backboard after the display panel 11 is assembled. In an example, a necessary unit 26 is disposed in the accommodation space 25, thereby the flat panel display device 10 can be made into an all-in-one machine. In an example, the display panel 11 can be a TFT-LCD liquid crystal panel, or an OLED display panel. When using a TFT-LCD liquid crystal panel as the display panel, a light source, an optical device, and the unit 26 can be disposed inside the accommodation space 25, so that the flat panel display device 10 can be made into an all-in-one machine.

In order to make a lighter and thinner flat panel display device 10, the body 21 of the backboard can be made by plastic plate comprising a first enhancing element as shown in FIGS. 2 and 3. In an example, the first enhancing element 27 can be a metallic framework, such as steel bar. The plastic plate comprising the first enhancing element 27 is, in fact, a composite material, which has the advantages of not only small density due to the plastic base part, but also high integral rigidity due to the first enhancing element. Therefore, body 21 of the backboard made by this material has not only a small thickness, but also sufficient rigidity, thereby enabling the flat panel display device 10 to be thinner and lighter.

The first enhancing element 27 can be substantially structured as I shape, W shape, M shape, or ∞ shape, and the like, by arranging the frame and reinforcing ribs thereof in an optionally interveined manner. FIG. 3 shows an I-shaped first enhancing element 27 having a frame 50 comprising four sides. Two reinforcing ribs 51 and 52 are connected with the two opposite sides of the frame 50. The number of the reinforcing ribs is not limited to two. There can be a plurality of reinforcing ribs. It should be noted that the reinforcing ribs 51 and 52 can be configured to match mounting members 53 and 53' for a wall rack (not shown) of the flat panel display device 10. For example, the mounting members 53 and 53' can be fixedly mounted to the reinforcing ribs 51 and 52, so that the stability of the wall rack of the flat panel display device 10 can be enhanced.

In order to enhance the rigidity of the backboard 20 and enable a relatively large and heavy display panel 11 to be assembled into the backboard 20, a second enhancing element 60 can be disposed inside the barrier wall 22, as shown in FIG. 2. In an example, the second enhancing element 60 can be a metallic framework or metal wires. Preferably, the metal wires are dispersedly distributed in the barrier wall 22, so that the rigidity of the barrier wall 22 over different directions can be the same.

The backboard 20 can be formed by feeding molten plastic into a mould, and next adding the first enhancing element 27 into the molten plastic, and then allowing the molten plastic cooled. In such a forming method, the first enhancing element 27 and the second enhancing element 60 can not only be conveniently embedded into the plastic, but also be firmly bound to the plastic base part after cooling, thereby improving the integral rigidity of the backboard 20.

FIG. 4 schematically shows the structure of a fastening structure for connecting the display panel 11 to the backboard 20. As shown in FIG. 4, the fastening structure comprises a first fastener 71 and a second fastener 72, which can be interlocked with each other. The first fastener 71 comprises a first belt 73 arranged in the stepped groove 24, on which a plurality of first projections 74 perpendicularly extending outward are provided. The second fastener 72 comprises a second belt 76 arranged on a mounting surface of the display panel 11, on which a plurality of second projections 77 perpendicularly extending outward are provided. The first fastener 71 and the second fastener 72 are coupled with each other through inserting the plurality of first projections 74 into the gaps formed among the plurality of second projections 77 respectively and inserting the plurality of second projections 77 into the gaps formed among the plurality of first projections 74 respectively.

In a preferred example, the first projections 74 each are structured as a first column 80, which is connected to the first belt 73 with a first end of the first column 80 and extends perpendicularly outward. A first sphere 81 is provided on a second end of the first column 80, the diameter of the first sphere 81 being larger than that of the first column 80. The second projections 77 each are structured as a second column 82, which is connected to the second belt 76 with a first end of the second column 82 and extends perpendicularly outward. A second sphere 83 is provided on a second end of the second column 82, the diameter of the second sphere 83 being larger than that of the second column 82. As shown in FIG. 4, the first fastener 71 and the second fastener 72 are interlocked with each other through accommodating the first spheres 81 in the spaces formed among the plurality of second columns 82 respectively and accommodating the second spheres 83 in the spaces among the plurality of first columns 80 respectively.

Although the present disclosure has been described with reference to preferred embodiments, various modifications and variants to the present disclosure may be made by anyone skilled in the art, without departing from the scope and spirit of the present disclosure. In particular, as long as there is no structural conflict, various embodiments as well as the respective technical features mentioned herein may be combined with one another in any manner. The present disclosure is not limited to the specific examples disclosed herein, but rather includes all the technical solutions falling within the scope of the claims.

The invention claimed is:

1. A flat panel display device, comprising a backboard and a display panel fitted therewith, an edge of the backboard being structured as a barrier wall extending perpendicular to the body of the backboard, wherein a stepped groove is arranged on the interior face of the barrier wall for supporting the display panel, so that an accommodation space is formed between the display panel and the body of the backboard, wherein the stepped groove extends from an outer end of the barrier wall towards the body of the backboard, and the depth of the stepped groove is consistent with the thickness of the display panel, so that the outer surface of the display panel is in the same plane as the outer end of the barrier wall, the display panel is fixed to the backboard through any one of glue, fastening structure, and magnetic absorption, and the fastening structure comprises a first fastener and a second fastener which can interlock with each other, wherein the first fastener is a first belt arranged in the stepped groove, on which a plurality of first projections perpendicularly extending outward are provided, and the second fastener is a second belt arranged on a mounting surface of the display panel, on which a plurality of second projections perpendicularly extending outward are provided, and the first fastener and the second fastener are coupled with each other through inserting the plurality of first projections into the gaps formed among the plurality of second projections respectively and inserting the plurality of second projections into the gaps formed among the plurality of first projections respectively.

2. The flat panel display device according to claim 1, wherein the body of the backboard and the base part of the barrier wall are made of plastic plate, a first enhancing element being provided inside the body of the backboard.

3. The flat panel display device according to claim 2, wherein the first enhancing element is a metallic framework.

4. The flat panel display device according to claim 3, wherein the metallic framework comprises a frame and reinforcing ribs connected with the opposite sides of the frame.

5. The flat panel display device according to claim 4, wherein the flat panel display device further comprises a mounting member for a wall rack, the mounting member being fixedly mounted to the reinforcing ribs.

6. The flat panel display device according to claim 2, wherein a second enhancing element is provided inside the barrier wall.

7. The flat panel display device according to claim 6, wherein the second enhancing element is a metallic framework or metal wires.

8. The flat panel display device according to claim 6, wherein the backboard is formed by adding the first enhancing element and the second enhancing element into molten plastic and then allowing the molten plastic cooled.

9. The flat panel display device according to claim 1, wherein the first projections each comprise a first column, which is connected to the first belt with one end of the first column and extends perpendicularly outward, and a first sphere connected to the other end of the first column, the diameter of the first sphere being larger than that of the first column, the second projections each comprise a second column, which is connected to the second belt with one end of the second column and extends perpendicularly outward, and a second sphere connected to the other end of the second column, the diameter of the second sphere being larger than that of the second column, and the first fastener and the second fastener are interlocked with each other through accommodating the first spheres in the spaces formed among the plurality of second columns respectively and accommodating the second spheres in the spaces among the plurality of first columns respectively.

\* \* \* \* \*